(12) United States Patent
Inoue et al.

(10) Patent No.: US 9,563,209 B2
(45) Date of Patent: Feb. 7, 2017

(54) RAW MATERIAL GAS SUPPLY METHOD

(71) Applicant: TOKYO ELECTRON LIMITED, Tokyo (JP)

(72) Inventors: Mitsuya Inoue, Nirasaki (JP); Makoto Takado, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 418 days.

(21) Appl. No.: 14/168,549

(22) Filed: Jan. 30, 2014

(65) Prior Publication Data

US 2014/0209022 A1  Jul. 31, 2014

(30) Foreign Application Priority Data

Jan. 31, 2013  (JP) .................................. 2013-017491

(51) Int. Cl.
  *C23C 16/52*  (2006.01)
  *G05D 16/00*  (2006.01)
  (Continued)

(52) U.S. Cl.
  CPC ........... *G05D 16/00* (2013.01); *C23C 16/4481* (2013.01); *C23C 16/45561* (2013.01);
  (Continued)

(58) Field of Classification Search
  CPC ... C23C 16/52; C23C 16/4481; C23C 16/4482
  See application file for complete search history.

(56) References Cited

U.S. PATENT DOCUMENTS 5,578,746 A * 11/1996 Campbell ................. G01F 1/74
                                                          73/28.01
2004/0121074 A1* 6/2004 Zhuang .................. C23C 16/40
                                                          427/255.32
(Continued)

FOREIGN PATENT DOCUMENTS

CN  101724828 A  6/2010
JP  4-214870 A  8/1992
(Continued)

OTHER PUBLICATIONS

Marcadal, C., et al., "Cu-CVD process optimized in a cluster equipment for IC manufacturing". Mircoelectronic Engineering 33 (1997) 3-13.

(Continued)

*Primary Examiner* — Bret Chen
(74) *Attorney, Agent, or Firm* — Nath, Goldberg & Meyer; Jerald L. Meyer

(57) ABSTRACT

A raw material gas supply method for use in a film forming apparatus which forms a film on a substrate, includes supplying a carrier gas to a gas phase zone defined inside a raw material container accommodating a liquid or solid raw material, vaporizing the raw material, supplying a raw material gas containing the vaporized raw material from the raw material container to the film forming apparatus via a raw material gas supply path, measuring a flow rate of the vaporized raw material flowing through the raw material gas supply path, comparing the flow rate of the vaporized raw material obtained by the flow rate measurement unit with a predetermined target value, and controlling an internal pressure of the raw material container to be increased when the flow rate is higher than the predetermined target value, and to be decreased when the is lower than the predetermined target value.

3 Claims, 5 Drawing Sheets

(51) Int. Cl.
*C23C 16/448* (2006.01)
*C23C 16/455* (2006.01)
*G05D 7/06* (2006.01)

(52) U.S. Cl.
CPC ...... *G05D 7/0676* (2013.01); *Y10T 137/0379* (2015.04); *Y10T 137/7758* (2015.04)

(56) References Cited

U.S. PATENT DOCUMENTS

| | | | |
|---|---|---|---|
| 2005/0095859 A1* | 5/2005 | Chen | C23C 16/4481 438/689 |
| 2008/0053439 A1 | 3/2008 | Lighton | |
| 2008/0141937 A1* | 6/2008 | Clark | C23C 16/16 118/697 |
| 2011/0197812 A1* | 8/2011 | Im | C23C 16/305 118/696 |
| 2014/0209021 A1* | 7/2014 | Inoue | C23C 16/4481 118/712 |
| 2014/0209022 A1 | 7/2014 | Inoue et al. | |

FOREIGN PATENT DOCUMENTS

| | | |
|---|---|---|
| JP | 5-305228 A | 11/1993 |
| JP | 9-63965 A | 3/1997 |

OTHER PUBLICATIONS

Alvesteffer, William J., et al., A Brief History of the Thermal Mass How Meter and Controller:. 2010 Summer Bulletin, Chapter 18 from 50 Years of Vacuum Coating Technology and the Growth of the Society of Vacuum Coaters, Donald M. Mattox and Vivienne Harwood Mattod, eds., Society of Vacuum Coaters. 2007, pp. 42-45.

* cited by examiner

| OPENING DEGREE OF PRESSURE CONTROL VALVE | INTERNAL PRESSURE OF RAW MATERIAL CONTAINER | VAPORIZATION FLOW RATE OF PMDA |
|---|---|---|
| ↘ | ↗ | ↘ |
| ↗ | ↘ | ↗ |

| SUPPLY AMOUNT OF PRESSURE CONTROL GAS | INTERNAL PRESSURE OF RAW MATERIAL CONTAINER | VAPORIZATION FLOW RATE OF PMDA |
|---|---|---|
| ↗ | ↗ | ↘ |
| ↘ | ↘ | ↗ |

RAW MATERIAL GAS SUPPLY METHOD

CROSS-REFERENCE TO RELATED APPLICATION

This application claims the benefit of Japanese Patent Application No. 2013-017491, filed on Jan. 31, 2013, in the Japan Patent Office, the disclosure of which is incorporated herein in its entirety by reference.

TECHNICAL FIELD

The present disclosure relates to a technique for controlling a flow rate of a raw material which is supplied to a film forming apparatus.

BACKGROUND

To form a film on a substrate (hereinafter, referred to as "wafer") such as a semiconductor wafer, various methods such as a CVD (Chemical Vapor Deposition) method, an ALD (Atomic Layer Deposition) method are used. The CVD method includes supplying a raw material gas onto a surface of a wafer, and heating the wafer such that the raw material gas is subjected to a chemical reaction. The ALD method includes adsorbing an atomic layer or molecular layer formed of a raw material gas onto a surface of a wafer, supplying a reaction gas for oxidization and reduction of the raw material gas to produce reaction products, and repeatedly performing a sequence of these operations to deposit layers, which are formed of the reaction products, on the wafer. The above operations are performed by supplying the raw material gas into a reaction chamber which accommodates a plurality of wafers and is in a vacuum atmosphere.

Raw materials used in the CVD and ALD methods, when they are vaporized into raw material gas, often have a low vapor pressure. Such raw material gas is obtained by supplying a carrier gas into a raw material container that accommodates a liquid or solid raw material, followed by vaporizing the raw material into the carrier gas. However, in the raw material gas supplied by such a method, a vaporization amount (vaporization flow rate) of the raw material per unit time is varied over time due to a reduction of the raw material received in the raw material container, a change in residence time of the carrier gas inside the raw material container, or the like.

The constant vaporization flow rate of the raw material may be maintained by controlling a heating temperature of the raw material container or adjusting a flow rate of the carrier gas. However, when the heating temperature is controlled, it may result in poor responsiveness. In addition, when the flow rate of the carrier gas is adjusted, it may generate dusts as the flow rate of the carrier gas increases.

In the related art, there has been suggested a chemical vapor deposition apparatus which supplies a bubbling gas into a bubbler with a liquid raw material, bubbles the liquid raw material and supplies a raw material gas consisting of the bubbling gas and the bubbled raw material gas into a reaction chamber. In this apparatus, an internal pressure of the bubbler is controlled to be higher than an internal pressure of the reaction chamber, which prevents the raw material gas from flowing backward. However, this conventional apparatus is outdated in terms of a relationship between the internal pressure of the bubbler and the vaporization flow rate of the raw material.

SUMMARY

Some embodiments of the present disclosure provide to a raw material gas supply device which is capable of stably supplying a vaporized raw material with better responsiveness, a film forming apparatus, a raw material gas supply method, and a non-transitory storage medium storing the method.

According to one embodiment of the present disclosure, provided is a raw material gas supply device for use in a film forming apparatus which forms a film on a substrate, which includes: a raw material container configured to accommodate a liquid or solid raw material; a carrier gas supply unit configured to supply a carrier gas to a gas phase zone defined inside the raw material container; a raw material gas supply path configured to supply a raw material gas containing a vaporized raw material from the raw material container to the film forming apparatus; a flow rate measurement unit configured to measure a flow rate of the vaporized raw material flowing through the raw material gas supply path; a pressure control unit configured to control an internal pressure of the raw material container; and a control unit configured to compare the measured flow rate of the vaporized raw material with a predetermined target value, and to control the pressure control unit to increase the internal pressure of the raw material container when the measured flow rate of the vaporized raw material is higher than the predetermined target value, and to decrease the internal pressure of the raw material container when the measured flow rate of the vaporized raw material is lower than the predetermined target value.

According to another embodiment of the present disclosure, provided is a film forming apparatus, which includes: the aforementioned raw material gas supply device; and a film formation processing device provided at a downstream side of the raw material gas supply device and configured to form a film on a substrate using a raw material gas supplied from the raw material gas supply device.

According to another embodiment of the present disclosure, provided is a raw material gas supply method for use in a film forming apparatus which forms a film on a substrate, the method including: supplying a carrier gas to a gas phase zone defined inside a raw material container, the raw material container accommodating a liquid or solid raw material; vaporizing the raw material; supplying a raw material gas containing the vaporized raw material from the raw material container to the film forming apparatus via a raw material gas supply path; measuring a flow rate of the vaporized raw material flowing through the raw material gas supply path; comparing the measured flow rate of the vaporized raw material obtained by the flow rate measurement unit with a predetermined target value; and controlling an internal pressure of the raw material container to be increased when the measured flow rate of the vaporized raw material is higher than the predetermined target value, and to be decreased when the measured flow rate of the vaporized raw material is lower than the predetermined target value.

According to another embodiment of the present disclosure, provided is a non-transitory storage medium storing a program for controlling a raw material gas supply device for use in a film forming apparatus configured to form a film on a substrate, wherein the program causes the raw material gas supply device to perform the aforementioned raw material gas supply method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figures 1, 2:
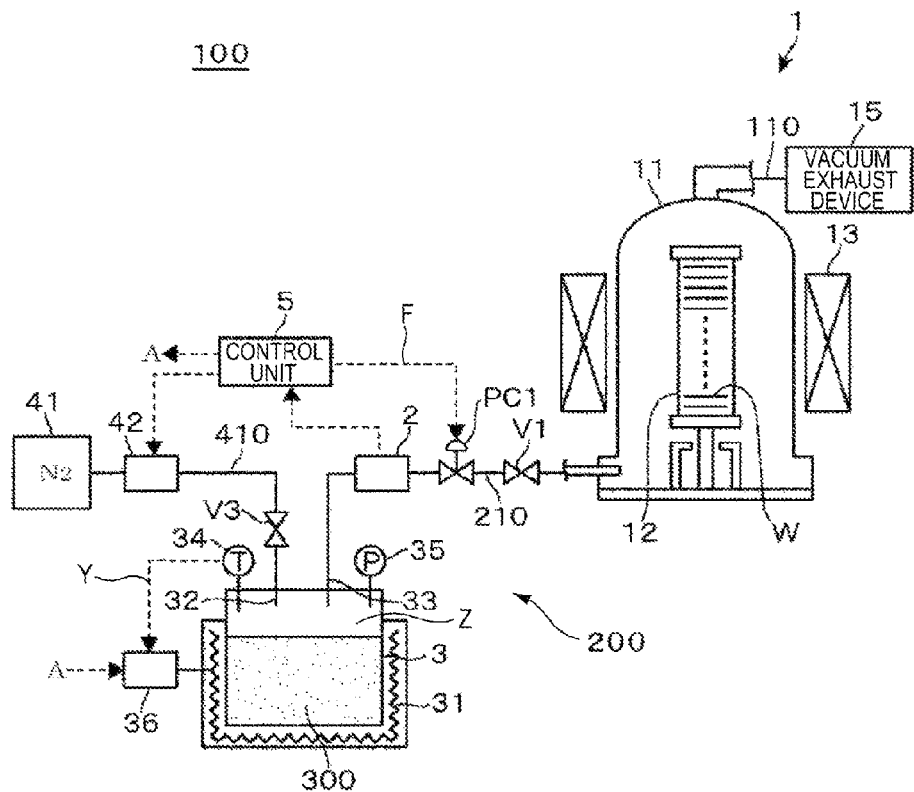
FIG. 1 is a view schematically showing an example of a configuration of a film forming apparatus including a raw material gas supply device according to one embodiment.
FIG. 2 is a view showing a relationship between an internal pressure of a raw material container and a vaporization flow rate of a raw material.

Hereinafter, an example of a configuration of a film forming apparatus including a raw material gas supply device of the present disclosure will be described with reference to FIG. 1. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 100 of the present disclosure includes a film formation processing device 1 configured to perform a film formation process on a substrate (e.g., wafer W) using a Chemical Vapor Deposition (CVD) method, and a raw material gas supply device 200 configured to supply a raw material gas into the film formation processing device 1.

The film formation processing device 1 corresponds to a main body of a batch type CVD equipment. In the film formation processing device 1, a wafer boat 12 with a plurality of wafers W loaded therein is transferred into a vertical reaction chamber 11 and subsequently, the reaction chamber 11 is evacuated by a vacuum exhaust unit 15 equipped with a vacuum pump or the like via an exhaust line 110. Thereafter, the raw material gas is supplied from the raw material gas supply device 200 into the reaction chamber 11 and subsequently, the wafers W are heated by a heating unit 13 installed around the reaction chamber 11. That is, the film formation process is performed by employing the above operations.

As an example, a formation of a polyimide-based organic insulating film will be described. The polyimide-based organic insulating film is formed when two kinds of raw materials such as pyromellitic dianhydride (PMDA) and 4,4'-diaminodiphenyl ether (ODA: 4,4'-Oxydianiline) react to each other. The raw material gas supply device 200 of FIG. 1 is configured to heat and sublimate (vaporize) one (e.g., the PMDA) of the two raw materials that is solid at normal temperature, and supply the same together with a carrier gas into the film formation processing device 1.

The raw material gas supply device 200 according to one embodiment includes a raw material container 3 configured to receive the raw material (e.g., the PMDA) therein, a carrier gas supply unit 41 configured to supply a carrier gas into the raw material container 3, and a raw material gas supply path 210 through which a raw material gas (consisting of a vaporized PMDA gas and the carrier gas) generated inside the raw material container 3 is flown into the film formation processing device 1.

The PMDA stored in the raw material container 3 corresponds to a solid raw material 300. The raw material container 3 is surrounded with a jacket-shaped heating unit 31 incorporating a resistance heating element therein. A temperature detection unit (T) 34 is configured to detect a temperature of a gas phase zone Z defined inside the raw material container 3 and provide the detected temperature to a power supply unit 36 as indicated by a dashed line Y. The power supply unit 36 increases or decreases an amount of power supplied to the raw material container 3 based on the detected temperature provided from the temperature detection unit (T) 34 and a control signal A supplied from a control unit 5 (which will be described later). In this way, an internal temperature of the raw material container 3 is controlled. The heating unit 31 is configured to heat the solid raw material 300 to a predetermined set temperature at which the solid raw material 300 can be vaporized and does not undergo a thermal decomposition. An example of the predetermined set temperature may include 250 degrees C.

A carrier gas nozzle 32 and a discharge nozzle 33 are connected to the gas phase zone Z defined above the solid raw material 300 in the raw material container 3. The carrier gas nozzle 32 is configured to introduce the carrier gas supplied from the carrier gas supply unit 41 into the raw material container 3 therethrough. The discharge nozzle 33 is configured to discharge the raw material gas generated inside the raw material container 3 to the raw material gas supply path 210 therethrough. The carrier gas nozzle 32 and the discharge nozzle 33 are opened in the gas phase zone Z. Further, a pressure detection unit (P) 35 configured to detect a pressure of the gas phase zone Z is connected to the raw material container 3.

The carrier gas nozzle 32 is coupled to a carrier gas flow path 410 in which a mass flow controller (MFC) 42 is installed. The carrier gas supply unit 41 is disposed at an upstream side of the carrier gas flow path 410. An example of the carrier gas may include an inert gas such as a nitrogen ($N_2$) gas and a helium (He) gas. In this embodiment, the $N_2$ gas is used as the carrier gas.

The MFC 42 includes, for example, a thermal mass flow meter (MFM), and a flow rate control unit which is configured to control a flow rate of the carrier gas flowing through the carrier gas flow path 410 to a predetermined level based on a flow rate measurement value of the carrier gas measured at the MFM. The MFM of the MFC 42 corresponds to a first flow rate measurement unit of this embodiment. The flow rate measurement value of the carrier gas measured at the MFM is defined as a first flow rate measurement value Q1 (that is approximately identical to a flow rate measurement value obtained at the MFC 42, which will be described later). Hereinafter, the first flow rate measurement value Q1 is sometimes referred to as a "flow rate Q1."

The discharge nozzle 33 is coupled to the raw material gas supply path 210. The raw material gas discharged from the raw material container 3 is supplied into the film formation processing device 1 via the raw material gas supply path 210. The interior of the raw material container 3 is evacuated by the vacuum exhaust unit 15 through the reaction chamber 11 and the raw material gas supply path 210, to maintain the interior of the raw material container 3 at a depressurized atmosphere.

In the raw material gas supply path 210, a mass flow meter (MFM) 2 configured to measure a flow rate of the raw material gas flowing therethrough, a pressure control valve PC1 used as a pressure control unit configured to control an internal pressure of the raw material container 3, and an on/off valve V1, are arranged in this order from the raw material container 3. The arrangement of the MFM 2 and the pressure control valve PC1 is not limited to this embodiment. In some embodiments, the pressure control valve PC1 may be arranged between the MFM 2 and the raw material container 3.

Figure 3:
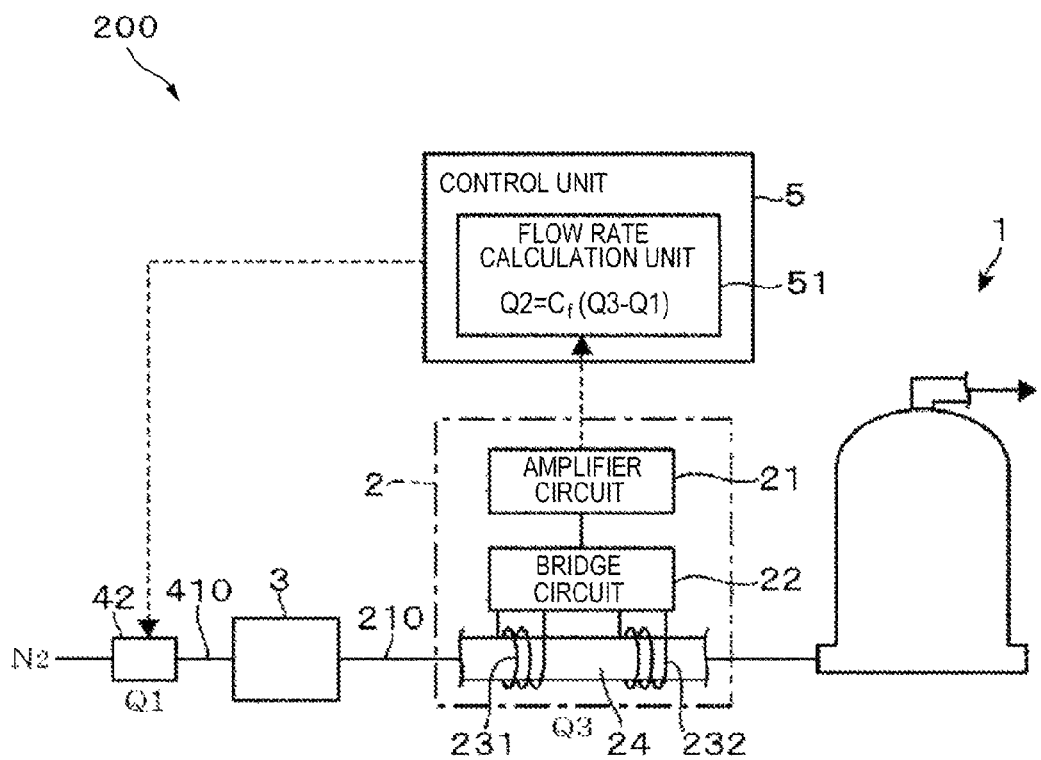
FIG. 3 is a view showing a configuration of a mass flow meter provided in a raw material gas supply device.

As shown in FIG. 3, the MFM 2 is arranged in the raw material gas supply path 210. The MFM 2 is configured as a thermal mass flow meter which includes a narrow tube part 24, resistive elements 231 and 232, a bridge circuit 22 and an amplifier circuit 21. The narrow tube part 24 through which the raw material gas discharged from the raw material container 3 is flown, is arranged in the raw material gas supply path 210. Each of the resistive elements 231 and 232 is wound around a tube wall of the narrow tube part 24 at upstream and downstream sides. The bridge circuit 22 and the amplifier circuit 21 are configured to detect a change in temperature of the tube wall of the narrow tube part 24 as a change in resistance of the respective resistive elements 231 and 232, and convert the change into a flow rate signal corresponding to a mass flow rate of the raw material gas. The change in temperature of the tube wall is caused by the raw material gas flowing through the narrow tube part 24.

The MFM 2 is calibrated by the carrier gas (the $N_2$ gas). When the carrier gas containing no the raw material (i.e., the PMDA) is flown through the MFM 2, the MFM 2 outputs a flow rate signal corresponding to the flow rate of the carrier gas. The flow rate signal varies in a range of, e.g., 0 to 5 [V]. Such a flow rate signal corresponds to a respective gas flow rate [sccm] over the full range including zero under a standard temperature and pressure: zero degree C. and 1 atm). Based on such a correspondence, a value obtained by converting the flow rate signal into the flow rate of the raw material gas is defined as a flow rate measurement value. The flow rate measurement value may be calculated by a flow rate calculation unit 51 (which will be described later) or the MFM 2.

When the raw material gas (consisting of the vaporized PMDA gas and the carrier gas) is flown through the MFM 2, a flow rate of the raw material gas is measured at the MFM 2. The MFM 2 corresponds to a second flow rate measurement unit of this embodiment. The flow rate of the raw material gas measured at the MFM 2 is defined as a second flow rate measurement value Q3 (hereinafter, sometimes referred to as a "flow rate Q3").

In the film forming apparatus 100 (including the film formation processing device 1 and the raw material gas supply device 200) configured as above, the raw material gas supply device 200 is connected to the control unit 5. The control unit 5 is configured with, e.g., a computer including a central processing unit (CPU) and a storage unit, which are not shown in drawings. The storage unit may store a program which includes steps (commands) allowing the control unit 5 to control a sequence of operations of the film forming apparatus 100. Specifically, the sequence of operations includes: loading the wafer boat 12 into the reaction chamber 11; evacuating the reaction chamber 11; supplying the raw material gas from the raw material gas supply device 200 for film formation; terminating the supply of the raw material gas; and unloading the wafer boat 12 from the reaction chamber 11. The program is stored in a storage medium, for example, a hard disk, a compact disk, a magneto-optical disk, and a memory card or the like, and is installed in the computer.

The control unit 5 controls the MFM 2 to calculate a current flow rate of the vaporized PMDA gas in the raw material container 3, and control the pressure control valve PC1 along a feedback line as indicated by a dashed line F in FIG. 1 based on the current flow rate of the vaporized PMDA gas calculated at the MFM 2, thus controlling the flow rate of the vaporized PMDA gas (hereinafter, referred to as a "vaporization flow rate of the PMDA").

Next, a process of controlling the vaporization flow rate of the PMDA will be described. FIG. 2 is a view showing a relationship between an internal pressure of the raw material container 3 and the vaporization flow rate of the PMDA which is vaporized per unit time within the raw material container 3. As shown in FIG. 2, the vaporization flow rate of the PMDA decreases as the internal pressure of the raw material container 3 increases, whereas the vaporization flow rate of the PMDA may increase as the internal pressure of the raw material container 3 decreases. When the total amount of vaporized PMDA gas is supplied into the film formation processing device 1, the vaporization flow rate measured at that time is defined as the flow rate of the PMDA contained in the raw material gas.

In this embodiment, an opening degree of the pressure control valve PC1 is used for controlling the internal pressure of the raw material container 3. Specifically, by narrowing the opening degree of the pressure control valve PC1, the internal pressure of the raw material container 3 is increased so that the vaporization flow rate of the PMDA is decreased. Conversely, by widening the opening degree of the pressure control valve PC1, the internal pressure of the raw material container 3 is decreased so that the vaporization flow rate of the PMDA is increased.

The control unit 5 compares a predetermined target value with the vaporization flow rate of the PMDA. If it is determined that the vaporization flow rate is higher than the predetermined target value, the control unit 5 narrows the opening degree of the pressure control valve PC1 to decrease the vaporization flow rate of the PMDA. Meanwhile, if it is determined that the vaporization flow rate is lower than the predetermined target value, the control unit 5 widens the opening degree of the pressure control valve PC1 to increase the vaporization flow rate of the PMDA. In some embodiments, in order to prevent an occurrence of hunting when controlling the internal pressure of the raw material container 3, the predetermined target value for the vaporization flow rate of the PMDA may be set to be within a predetermined control range. In other words, when the predetermined target value exceeds an upper limit of the predetermined control range, the opening degree of the pressure control valve PC1 may be narrowed by the control unit 5. Meanwhile, when the predetermined target value falls below a lower limit of the predetermined control range, the control unit 5 may widen the opening degree of the pressure control valve PC1.

In this way, the control unit 5 calculates the vaporization flow rate of the PMDA based on the flow rate of the raw material gas measured at the MFM2, and compares the calculated vaporization flow rate with the predetermined target value, thus controlling the internal pressure of the raw material container 3. Therefore, in order to accurately control the flow rate of the PMDA, it is necessary that the vaporization flow rate of the PMDA calculated by the control unit 5 correctly represents an actual flow rate of the vaporized PMDA gas inside the raw material container 3.

The thermal MFM 2 shown in FIG. 3 is usually used to measure a flow rate of gas having a constant component ratio. When the component ratio of the gas is varied, it is necessary to modify a conversion factor which is used in converting measurement results of the mass flow meter into an actual flow rate. As such, the thermal mass flow meter may not be able to correctly measure the mass flow rate unless the conversion factor is modified in response to a variation in component ratios of the raw material gas. The raw material gas supply device 200 of this embodiment calculates the flow rate of the PMDA using the following method.

Although in the above, the MFM 2 has been described to be calibrated by the carrier gas, the MFM 2 may occasionally fail to correctly measure the flow rate Q3 of the raw material gas which contains both the vaporized PMDA gas and the carrier gas flowing through the raw material gas supply path 210. In this case, the component ratio of the vaporized PMDA gas to the carrier gas in the raw material gas at that time is calculated. However, in this embodiment, by also flowing the carrier gas only (without the vaporized PMDA gas) through the MFM 2, it is possible to obtain a correct flow rate. Further, by the MFC 42 arranged at the upstream side of the raw material container 3 in the raw material gas supply device 200, the carrier gas is controlled to flow at the flow rate Q1 corresponding to a predetermined set value.

As shown in FIG. 3, the control unit 5 of this embodiment includes a flow rate calculation unit 51 which is configured to calculate the vaporization flow rate Q2 of the raw material contained in the raw material gas, based on the flow rate Q3 of the raw material gas that is measured at the MFM 2, and the flow rate Q1 (the predetermined set value) of the carrier gas.

Figure 4:
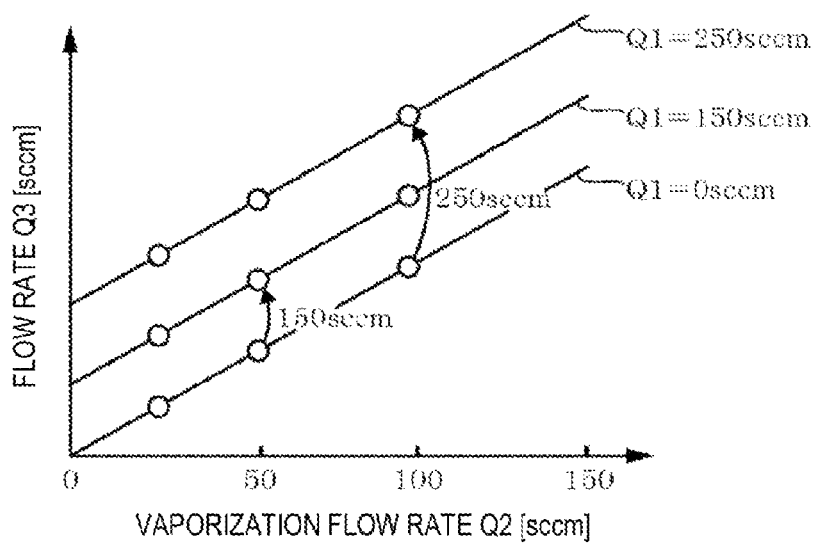
FIG. 4 is a graph showing a relationship between a vaporization flow rate of a raw material and a flow rate measurement value obtained by a mass flow meter.

FIG. 4 is a graph showing a variation in the flow rate Q3 of the raw material gas that is measured at the MFM 2 as a function of the flow rate Q1 of the carrier gas and the vaporization flow rate Q2 of the raw material with Q2 [sccm] as a horizontal axis and Q3 [sccm] as a vertical axis. In FIG. 4, the flow rate Q1 of the carrier gas is used as a parameter.

As shown in FIG. 4, when the flow rate Q1 of the carrier gas is, e.g., 0 [sccm], the vaporization flow rate Q2 of the raw material (i.e., the PMDA) bears a proportionate relationship to the flow rate Q3 obtained by flowing the raw material gas through the MFM 2. In the circumstance, when the carrier gas is supplied at the flow rate Q1 of 150 [sccm] and is mixed with the vaporized PMDA gas, the MFM 2 adds the flow rate Q1 of 150 [sccm] to the flow rate Q1 of 0 [sccm] and outputs the added flow rate as the flow rate Q3. Similarly, when the carrier gas is supplied at the flow rate Q1 of 250 [sccm] and is mixed with the vaporized PMDA gas, the MFM 2 adds the flow rate Q1 of 250 [sccm]) to the flow rate Q1 of 0 [sccm] and outputs the added flow rate as the flow rate Q3.

Assuming that the aforementioned proportionate relationship is established, a difference value (Q3−Q1) between the flow rate Q3 and the flow rate Q1 (i.e., the predetermined set value) represents a value obtained when the flow rate Q1 is 0 [sccm] as shown in FIG. 4. In view of the foregoing, a proportionality coefficient $C_f$ between the vaporization flow rate Q2 of the raw material and the flow rate Q3 of the raw material gas is previously determined Thus, by multiplying the difference value by the proportionality coefficient $C_f$, the vaporization flow rate Q2 of the raw material can be obtained by the following equation:

$$Q2=C_f(Q3-Q1) \qquad \text{Eq. (1)}$$

The flow rate calculation unit 51 calculates the vaporization flow rate Q2 of the raw material using the above equation Eq. (1) based on the program stored in the storage unit of the control unit 5. According to this calculation, even if the concentration of the raw material (i.e., the PMDA) contained in the raw material gas is varied, which makes it difficult to determine the conversion factor which is used in obtaining the correct flow rate of the raw material gas, the flow rate calculation unit 51 can calculate the vaporization flow rate Q2 of the raw material.

Figure 5:
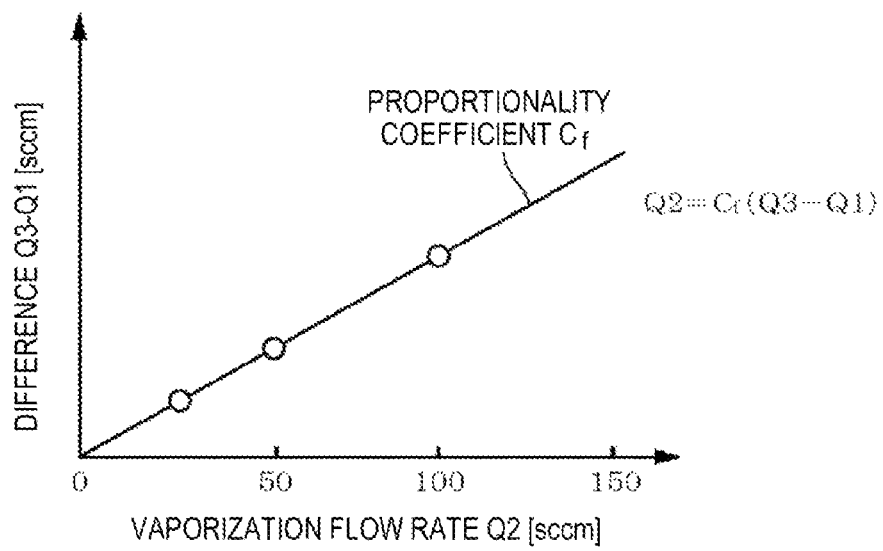
FIG. 5 is a graph showing a relationship between a difference between a flow rate measurement value and a flow rate of a carrier gas as a function of a vaporization flow rate.

For example, the proportionality coefficient $C_f$ can be determined by the following method. The raw material gas is generated by calculating a weighing capacity of the raw material container 3 which receives the solid raw material 300 used as the raw material therein, followed by changing a heating temperature of the heating unit 31, followed by supplying the carrier gas into the raw material container 3 at the flow rate Q1. The vaporization flow rate Q2 is determined based on a change in weight of the solid raw material 300, and the flow rate Q3 is obtained by flowing the raw material gas through the MFM 2. As shown in FIG. 4, the flow rate Q3 is determined as a function of the flow rate Q1 of the carrier gas and the vaporization flow rate Q2 so that the relationship between the vaporization flow rate Q2 and the flow rate Q3 is obtained. If it is confirmed that the relationship in which the flow rate Q1 of the carrier gas is added to the flow rate Q3 (that is obtained when the flow rate of the carrier gas is 0 [sccm]) is established, the difference value (Q3−Q1) is calculated. As shown in FIG. 5, the proportionality coefficient $C_f$ is determined by dividing the vaporization flow rate Q2 by the difference value.

It was found from an experimental example that the vaporization flow rate Q2 of the raw material contained in the raw material gas can be measured using the MFM 2 calibrated by the carrier gas and the above equation Eq. (1). In the experimental example, an alternative gas which has a viscosity and molecular weight similar to the PMDA gas (having a viscosity of $1.4 \times 10^{-5}$ [Pa·s] and a molecular weight of 218) was used. A hydrogen ($H_2$) gas (having a viscosity of $1.3 \times 10^{-5}$ [Pa·s] and a molecular weight of 2) which has a viscosity similar to the PMDA gas, and a sulfur hexafluoride ($SF_6$) gas (having a viscosity of $2.5 \times 10^{-5}$ [Pa·s] and a molecular weight of 146) having a molecular weight similar to PMDA gas, were used as the alternative gas. Each of the alternative gases whose flow rate Q2 is controlled by a respective mass flow controller, was mixed with the $N_2$ gas whose flow rate Q1 is controlled by the MFC 42. The flow rate Q3 of the mixed gas was measured by the MFM 2.

In this experimental example, an approximate straight-line of the difference value (Q3−Q1) to the flow rate Q2 was obtained using a least square method. The experimental examples have shown that a deviation of an estimation supply flow rate (which is obtained by substituting the difference value (Q3−Q1) into the approximate straight-line) from the actual supply flow rate Q2 falls within a range of ±2% for both the alternative gases.

Next, an operation of the film forming apparatus 100 according to another embodiment will be described with reference to FIGS. 1, 6 and 7.

First, the wafer boat 12 is loaded into the reaction chamber 11 and the interior of the reaction chamber 11 is subsequently evacuated. Thereafter, the on/off valve V3 is opened, and the carrier gas is supplied from the carrier gas supply unit 41 into the raw material container 3 while being adjusted to the flow rate Q1 corresponding to the predetermined set value. In this process, the raw material gas is generated. Subsequently, the raw material gas is supplied into the film formation processing device 1 where the wafers W are heated by the heating unit 13. On a surface of the heated wafer W, the vaporized PMDA gas contained in the raw material gas reacts with the ODA gas that is supplied through a raw material gas supply line (not shown). Thus, the polyimide-based organic insulating film is formed on the surface of the wafer W.

Figure 6:
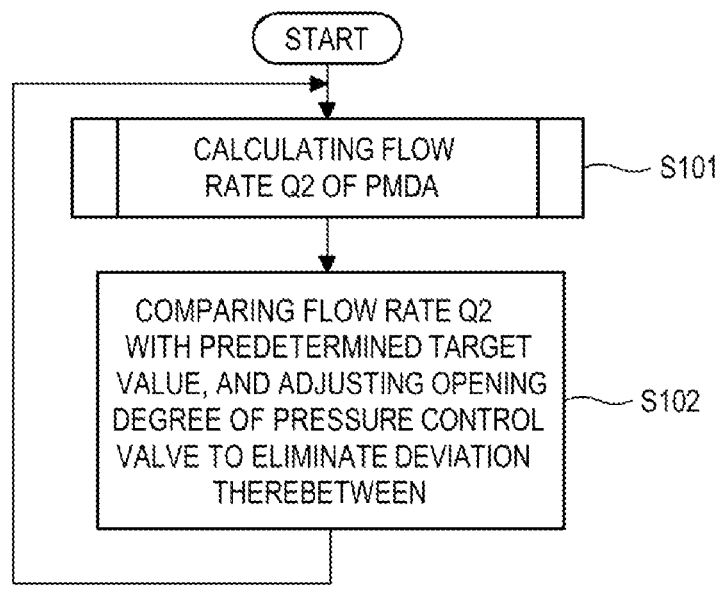
FIG. 6 is a flowchart showing a sequence of operations for controlling a vaporization flow rate of a raw material.
Figure 7:
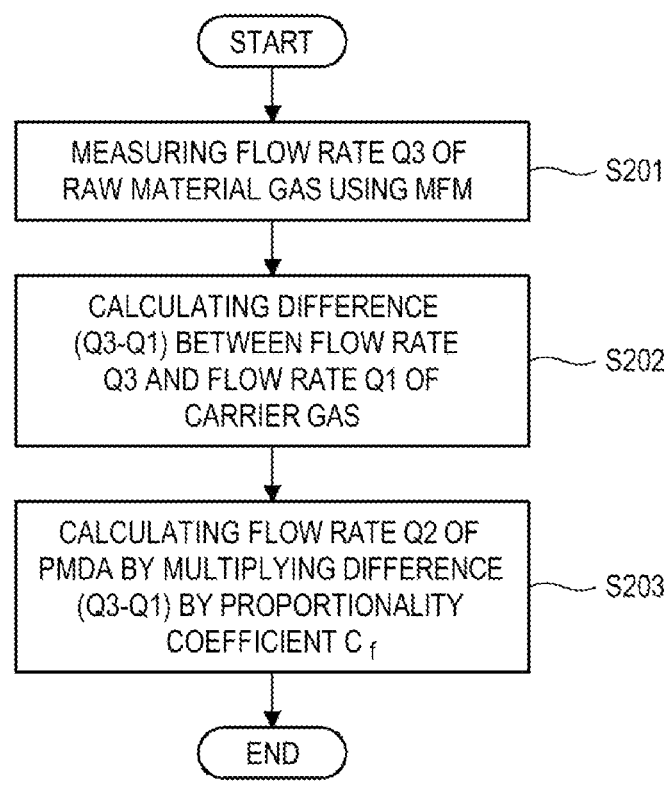
FIG. 7 is a flowchart showing a detailed operation of calculating the vaporization flow rate of the raw material in FIG. 6.

At this time, the control unit 5 calculates the vaporization flow rate Q2 of the PMDA based on the flow rate Q3 of the raw material gas obtained at the MFM 2 (Step S101 of FIG. 6). Thereafter, the control unit 5 compares the vaporization flow rate Q2 with the predetermined target value and adjusts the opening degree of the pressure control valve PC1 according to the result of the comparison such that a deviation of the predetermined target value from the vaporization flow rate Q2 is minimized (Step S102).

Next, the operation of calculating the vaporization flow rate Q2 of the PMDA in Step S101 will be described in detail with reference to FIG. 7. The raw material gas discharged from the discharge nozzle 33 is flown through the MFM 2 where the flow rate Q3 of the raw material gas is measured (Step S201 of FIG. 7). The flow rate calculation unit 51 calculates the difference value (Q3−Q1) between the flow rate Q3 and the predetermined set value (i.e., the flow rate Q1) of the carrier gas (Step S202).

The MFC 42 is configured to control the flow rate Q1 of the carrier gas based on the flow rate measurement value of the carrier gas that is measured using the incorporated MFM as described above. It should be noted that therefore, when the flow rate Q3 of the raw material gas is stable, the flow rate Q1 of the carrier gas falls within an allowable range of error. In this embodiment, the predetermined set value of the MFC 42 was used as the flow rate Q1 of the carrier gas. Alternatively, the flow rate calculation unit 51 may calculate the difference value (Q3−Q1) based on the flow rate measurement value provided from the MFM of the MFC 42.

Thereafter, the flow rate calculation unit 51 calculates the vaporization flow rate Q2 of the raw material (the PMDA) by multiplying the difference value (Q3−Q1) by the proportionality coefficient $C_f$ (Step S203). The opening degree of the pressure control valve PC1 is adjusted based on the vaporization flow rate Q2 of the PMDA calculated as above such that the internal pressure of the raw material container 3 is controlled. By controlling the internal pressure of the raw material container 3, it is possible to shorten a response time compared to a case where the vaporization flow rate Q2 of the PMDA is controlled by changing the temperature of the raw material container 3. Furthermore, since a flow state of the gas passing through the raw material container 3 or the respective paths 410 and 210 is stable as compared to a case where the vaporization flow rate of the PMDA is controlled by a variation in flow rate of the carrier gas, it is possible to suppress particles adhered to inner wall surfaces of the raw material container 3 or the respective paths 410 and 210 from being scattered (or risen) due to the variation.

After a predetermined period of time, the carrier gas supply unit 41 stops supplying the carrier gas. Simultaneously, the on/off valve V1 is closed and the supply of the raw material gas containing the raw material (the PMDA) into the film formation processing device 1 is terminated. In addition, after stopping the supply of the raw material gas containing the ODA into the film formation processing device 1, the interior of the reaction chamber 11 is kept at the atmospheric pressure. Thereafter, the wafer boat 12 is unloaded from the reaction chamber 11 and the sequence of film forming processes is completed.

In the raw material gas supply device 200 according to this embodiment, the following effects are manifested. Since the vaporization flow rate of the PMDA contained in the raw material gas is controlled by controlling the internal pressure of the raw material container 3 which is configured to vaporize the received PMDA, it is possible to control the vaporization flow rate of the raw material with a high responsiveness. Further, since the vaporization flow rate of the raw material is controlled by adjusting the internal pressure of the raw material container 3 while keeping the flow rate of the carrier gas at a constant level, it is possible to supply the raw material gas at a stable flow rate.

Figures 8, 9:
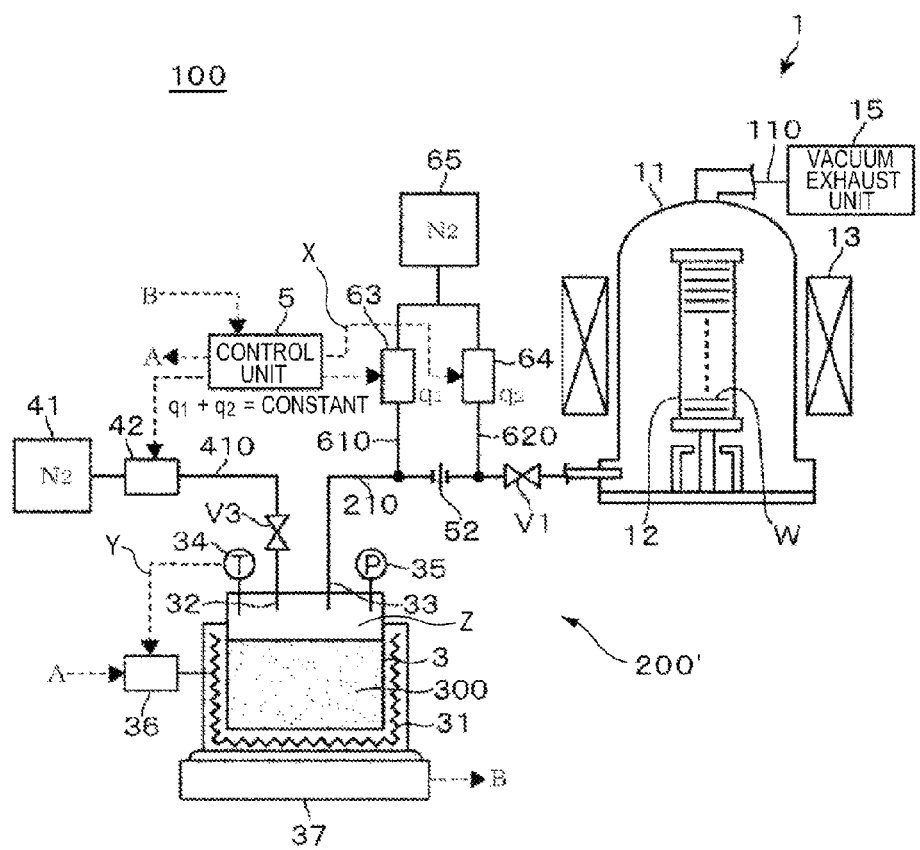
FIG. 8 is a view schematically showing a configuration of a film forming apparatus including a raw material gas supply device according to some embodiments.
FIG. 9 is a view showing a relationship between an amount of a pressure control gas and a vaporization flow rate of a raw material.

Next, a configuration of a raw material gas supply device 200′ according to another embodiment will be described with reference to FIG. 8. In FIG. 8, the same reference numerals will be used to describe the configurations that are equal or similar to those shown in FIG. 1.

The raw material gas supply device 200′ shown in FIG. 8 is different from the raw material gas supply device 200 shown in FIG. 1 in that the internal pressure of the raw material container 3 is controlled by supplying a pressure control gas to the raw material gas supply path 210 through a pressure control gas supply path 610, without having to use the pressure control valve PC1. In addition, the raw material gas supply device 200′ of FIG. 8 is different from the raw material gas supply device 200 of FIG. 1 in that the vaporization flow rate Q2 of the PMDA is calculated based on a change in weight of the raw material container 3 with the received PMDA, without having to use the method of calculating the vaporization flow rate Q2 of the PMDA based on the difference value (Q3−Q1) between the flow rate Q3 of the raw material gas and the flow rate Q1 of the carrier gas.

The pressure control gas supply path 610 is coupled to a $N_2$ gas supply unit 65 via a MFC 63. The pressure control gas supply path 610, the $N_2$ gas supply unit 65 and the MFC 63 constitute a pressure control gas supply unit of this embodiment. In this embodiment, the $N_2$ gas used as the carrier gas is employed as the pressure control gas. Further, a position at which the pressure control gas is supplied, is set at a position where the internal pressure of the raw material container 3 can be varied within a predetermined range by adjusting a supply amount of the pressure control gas, in consideration of, e.g., a pressure loss of a pipe line extending from the raw material container 3 to the position at which the pressure control gas is supplied.

Next, a relationship between an amount of the pressure control gas supplied from the pressure control gas supply unit and a flow rate (i.e., the vaporization flow rate Q2) of the PMDA will be described with reference to FIG. 9. Initially, the pressure control gas is supplied to the raw material gas supply path 210 at, e.g., a flow rate $q_1$ [sccm]. At this time, when a supply amount of the pressure control gas is increased, the internal pressure of the raw material container 3 connected to the raw material gas supply path 210 is increased, which decreases the vaporization flow rate Q2 of the PMDA. Meanwhile, when the supply amount of the pressure control gas is decreased, the internal pressure of the raw material container 3 is decreased, which increases the vaporization flow rate Q2 of the PMDA.

Accordingly, the control unit 5 compares the predetermined target value with the vaporization flow rate Q2 of the PMDA. If it is determined that the vaporization flow rate Q2 is higher than the predetermined target value, the control unit 5 increases the supply flow rate q1 [sccm] of the pressure control gas to decrease the vaporization flow rate Q2 of the PMDA. Meanwhile, if it is determined that the vaporization flow rate Q2 is lower than the predetermined target value, the control unit 5 decreases the supply flow rate q1 [sccm] of the pressure control gas to increase the vaporization flow rate Q2 of the PMDA. In some embodiments, in order to prevent an occurrence of hunting when controlling the internal pressure of the raw material container 3, the predetermined target value for the vaporization flow rate Q2 of the PMDA may be set to be within a predetermined control range similar to the embodiment in which the opening degree of the pressure control valve PC1 is controlled.

In FIG. 8, a weight meter 37, which is used as a weight measurement unit, is configured to measure a weight of the raw material container 3. In this embodiment, the control unit 5 includes a flow rate calculation unit which is configured to calculate the vaporization flow rate Q2 of the PMDA in response to a change in the weight (which is indicated by a symbol "B" in FIG. 8) measured at the weight meter 37 over time.

The calculation method of the vaporization flow rate Q2 of the PMDA is not limited to the above. Alternatively, the vaporization flow rate Q2 may be calculated based on the difference value (Q3−Q1) between the flow rate Q3 of the raw material gas and the flow rate Q1 of the carrier gas as described with reference to FIG. 5. In some embodiments, the internal pressure of the raw material container 3 may be controlled using the vaporization flow rate Q2 of the PMDA that is calculated based on the weight (see the symbol "B") measured at the weigh meter 37 without having to use the pressure control valve PC1 shown in FIG. 1.

When the internal pressure of the raw material container 3 is controlled by the supply of the pressure control gas as described above, a change in concentration of the PMDA contained in the raw material gas (which corresponds to a sum of the carrier gas, the pressure control gas and the PMDA), which is supplied into the film formation processing device 1, may be caused. In order to address the change, in this embodiment shown in FIG. 8, a buffer gas for preventing a fluctuation of the supply amount of the pressure control gas, is supplied to a downstream side of a position at which the pressure control gas is supplied in the raw material gas supply path 210.

The buffer gas is supplied to the raw material gas supply path 210 via the buffer gas supply path 620. The buffer gas supply path 620 is coupled to the $N_2$ gas supply unit 65 via the MFC 64. The buffer gas supply path 620, the $N_2$ gas supply unit 65 and the MFC 64 constitute a buffer gas supply unit of this embodiment.

When the supply amount $q_1$ [sccm] of the pressure control gas supplied through the pressure control gas supply path 610 is varied depending on the vaporization flow rate Q2 of the PMDA, the control unit 5 controls the MFC 64 (which is used in controlling the buffer gas) as indicated by a symbol "X" in FIG. 8 so as to make the sum (i.e., $q_1+q_2$) of the supply amount $q_1$ of the pressure control gas and a supply amount $q_2$ [sccm] of the buffer gas supplied through the buffer gas supply path 620 to be maintained substantially at a constant value.

As a result, the total flow rate of the carrier gas, the pressure control gas and the buffer gas contained in the raw material gas becomes substantially constant. With this configuration, the vaporization flow rate Q2 of the PMDA is adjusted to meet the predetermined target value by controlling the internal pressure of the raw material container 3, which makes it possible to supply the raw material gas containing a stable concentration of the PMDA into the film formation processing device 1.

As shown in FIG. 8, an orifice 52 used as a differential pressure generating unit is installed in the raw material gas supply path 210. The orifice 52 is configured to increase a difference in pressure between the supply position of the pressure control gas and the supply position of the buffer gas. The orifice 52 prevents the buffer gas from influencing (disturbing) the control of the internal pressure of the raw material container 3 using the pressure control gas. While the orifice 52 has been described to be used as the differential pressure generating unit, the present disclosure is not limited thereto. In some embodiments, a valve having an adjustable opening degree may be used.

In some embodiments, in a case where a diameter of a pipeline of the raw material gas supply path 210 is small or the supply positions of the pressure control gas and the buffer gas are separated from each other, when a pressure loss occurring in the pipeline itself is sufficiently large and the supply of the buffer gas slightly influences the control of the internal pressure of the raw material container 3, the differential pressure generating unit may not be omitted.

While in the embodiments shown in FIGS. 1 and 8, each of the pressure control valve PC1 and the pressure control gas supply unit has been described to be used as the pressure control unit, a set of the pressure control valve PC1 and the pressure control gas supply unit may be used in controlling the internal pressure of the raw material container 3 in a single raw material gas supply device (200 or 200').

While in the above embodiments, the PMDA, which is used as a raw material of the polyimide-based organic insulating film and is solid at the normal temperature, has been described to be supplied using the raw material gas supply device 200 or 200' of the present disclosure, the present disclosure is not limited thereto. In some embodiments, the ODA, which is another raw material of the polyimide-based organic insulating film and is solid at the normal temperature, may be supplied. Specifically, by the aforementioned method, it is possible to calculate the flow rate of the raw material gas that is obtained by heating the ODA until it is liquefied, introducing the carrier gas into the liquid ODA, and bubbling the liquid ODA into the carrier gas. Furthermore, the present disclosure may be applied in measuring a flow rate of a raw material, which is used in forming a thin film containing various metals such as aluminum, hafnium, and zirconium, including trimethyl aluminum (TMA), triethyl aluminum (TEA), tetradimethylamino hafnium (TDMAH), tetrakisethylmethylamino hafnium (TEMAH), tetrakisethylmethylamino zirconium (TEMAZ) or the like.

Furthermore, while in the raw material supply device 200 or 200' shown in the embodiments of FIGS. 1 and 8, the temperature of the raw material container 3 and the flow rate Q1 of the carrier gas has been described to be constantly set, they may be varied as necessary.

According to the present disclosure in some embodiments, a vaporization flow rate of the raw material is controlled by adjusting an internal pressure of a raw material container configured to vaporize the raw material, thus easily controlling the vaporization flow rate with high responsiveness. Furthermore, the vaporization flow rate of the raw material can be controlled by adjusting the internal pressure of the raw material container even in a state where a flow rate of a carrier gas is constantly maintained, which makes it possible to supply a raw material gas with a high flow rate stability.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A raw material gas supply method for use in a film forming apparatus which forms a film on a substrate, the method comprising:
   supplying a carrier gas to a gas phase zone defined inside a raw material container, the raw material container accommodating a liquid or solid raw material;
   vaporizing the raw material;
   supplying a raw material gas containing the vaporized raw material from the raw material container to the film forming apparatus via a raw material gas supply path;
   measuring a flow rate of the vaporized raw material flowing through the raw material gas supply path;
   comparing the measured flow rate of the vaporized raw material with a predetermined target value;
   controlling an internal pressure of the raw material container to be increased when the measured flow rate of the vaporized raw material is higher than the predetermined target value, and to be decreased when the measured flow rate of the vaporized raw material is lower than the predetermined target value;
   supplying a buffer gas to a downstream side of a position at which the pressure control gas is supplied in the raw material gas supply path; and
   controlling a supply amount of the pressure control gas and a supply amount of the buffer gas such that a sum of the supply amount of the pressure control gas and the supply amount of the buffer gas becomes constant,
   wherein controlling an internal pressure of the raw material container is preformed by supplying a pressure control gas to the raw material gas supply path.

2. The method of claim 1, wherein controlling an internal pressure of the raw material container is performed by adjusting an opening degree of a pressure control valve provided in the raw material gas supply path.

3. A non-transitory storage medium storing a program for controlling a raw material gas supply device for use in a film forming apparatus configured to form a film on a substrate, wherein the program causes the raw material gas supply device to perform the method of claim 1.

* * * * *

UNITED STATES PATENT AND TRADEMARK OFFICE
CERTIFICATE OF CORRECTION

PATENT NO. : 9,563,209 B2  
APPLICATION NO. : 14/168549  
DATED : February 7, 2017  
INVENTOR(S) : Inoue Page 1 of 1

It is certified that error appears in the above-identified patent and that said Letters Patent is hereby corrected as shown below:

In the Claims

Claim 1, Column 14, Line 19, replace "container is preformed" with "container is performed".

Signed and Sealed this
Twenty-eighth Day of March, 2017

Michelle K. Lee
*Director of the United States Patent and Trademark Office*